US012589451B2

(12) United States Patent
Nitanai

(10) Patent No.: US 12,589,451 B2
(45) Date of Patent: Mar. 31, 2026

(54) PASTE COMPOSITION AND SEMICONDUCTOR DEVICE

(71) Applicant: KYOCERA Corporation, Kyoto (JP)

(72) Inventor: Yuya Nitanai, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 504 days.

(21) Appl. No.: 18/042,894

(22) PCT Filed: Aug. 4, 2021

(86) PCT No.: PCT/JP2021/028907
§ 371 (c)(1),
(2) Date: Feb. 24, 2023

(87) PCT Pub. No.: WO2022/044737
PCT Pub. Date: Mar. 3, 2022

(65) Prior Publication Data
US 2023/0238348 A1 Jul. 27, 2023

(30) Foreign Application Priority Data

Aug. 31, 2020 (JP) ................................. 2020-145617

(51) Int. Cl.
*H01L 23/00* (2006.01)
*B23K 35/02* (2006.01)
(Continued)

(52) U.S. Cl.
CPC ............ *H01L 24/29* (2013.01); *B23K 35/025* (2013.01); *B23K 35/3006* (2013.01);
(Continued)

(58) Field of Classification Search
CPC ............ B23K 35/3613; B23K 35/3006; B23K 35/025; B23K 2101/40; B22F 7/062; B22F 1/107; B22F 1/052; B22F 7/08; B22F 1/0655; B22F 1/103; B22F 1/148; B22F 9/24; B22F 3/03; B22F 1/065; B22F 2007/047; B22F 2998/10; B22F 2003/145; H01L 24/32; H01L 24/29; H01L 23/293; H01L 2224/29499; H01L 2224/32225; H01L 2224/32245; H01L 2224/29339; H01L 2924/12041; H01L 2924/35121; H01L 2224/29291; H01B 1/22; H05K 1/0326; C08L 63/00; C08L 2203/16; C08L 2203/206; C08L 2201/08; C08G 59/3218;
(Continued)

(56) References Cited

U.S. PATENT DOCUMENTS

| | | | | | |
|---|---|---|---|---|---|
| 11,155,936 | B2 * | 10/2021 | Fukushima | ............ | D04B 21/18 |
| 2005/0207930 | A1 * | 9/2005 | Yamaguchi | ............ | B82Y 30/00 419/9 |

(Continued)

FOREIGN PATENT DOCUMENTS

| | | |
|---|---|---|
| CN | 103396744 A | 11/2013 |
| CN | 104246910 A | 12/2014 |

(Continued)

*Primary Examiner* — Mouloucoulaye Inoussa
(74) *Attorney, Agent, or Firm* — Volpe Koenig

(57) ABSTRACT

This paste composition includes silver particles (A), a thermosetting resin (B), a curing agent (C), and a solvent (D). A shrinkage rate after curing of the paste composition is 15% or less.

17 Claims, 2 Drawing Sheets

(51) Int. Cl.
*B23K 35/30* (2006.01)
*B23K 35/36* (2006.01)
*B23K 101/40* (2006.01)

(52) U.S. Cl.
CPC .......... *B23K 35/3613* (2013.01); *H01L 24/32* (2013.01); *B23K 2101/40* (2018.08); *H01L 2224/29291* (2013.01); *H01L 2224/29339* (2013.01); *H01L 2224/29499* (2013.01); *H01L 2224/32225* (2013.01); *H01L 2224/32245* (2013.01); *H01L 2924/12041* (2013.01); *H01L 2924/35121* (2013.01)

(58) Field of Classification Search
CPC ........ C08G 59/20; C08G 59/245; C08K 3/08; C08K 7/06; C08K 3/36; C08K 3/013; C08K 5/0025; C08K 2003/0806; C08K 2003/085; C08K 2201/001; C08J 5/24; C08J 5/18; C08J 2363/00; C09J 163/00; C09J 11/02; C09J 9/02; C09J 133/06; C09J 175/14; C09J 133/26; C09J 2203/326; G02B 1/14; C04B 35/62802; C04B 35/62625; C04B 35/62892; C04B 35/62844; C04B 2235/5445; C04B 2235/61; C04B 2235/604; C04B 2235/5436; C04B 2235/3217; B33Y 70/10; Y02P 10/25; B32B 27/32; B32B 27/08; B32B 7/027; H01G 11/06; H01G 11/52; H01M 50/457; H01M 50/443; H01M 50/489; H01M 10/0525; H01M 50/451; H01M 50/491; H01M 50/417
See application file for complete search history.

(56) References Cited

U.S. PATENT DOCUMENTS

| | | | |
|---|---|---|---|
| 2009/0146117 A1 | 6/2009 | Suenaga et al. | |
| 2011/0166243 A1* | 7/2011 | Kikuchi ............. | H01M 50/417 521/134 |
| 2011/0256419 A1* | 10/2011 | Iwayama ............. | C22C 1/1068 164/94 |
| 2011/0318249 A1* | 12/2011 | Nakayama ............. | C01B 37/00 423/325 |
| 2014/0346412 A1 | 11/2014 | Okamoto et al. | |
| 2015/0115018 A1 | 4/2015 | Hori et al. | |
| 2015/0247067 A1 | 9/2015 | Iseda et al. | |
| 2016/0237322 A1 | 8/2016 | Shi | |
| 2017/0033348 A1* | 2/2017 | Murakami ............ | H01M 4/131 |
| 2017/0110735 A1* | 4/2017 | Ito ............................. | D01F 9/21 |
| 2018/0369757 A1* | 12/2018 | Yasuda .................. | B01D 69/08 |
| 2018/0369908 A1* | 12/2018 | Muto ........................ | B22F 9/24 |
| 2019/0088917 A1* | 3/2019 | Katada ................ | H01M 50/403 |
| 2020/0035972 A1* | 1/2020 | Ahn ........................ | C08L 23/06 |
| 2020/0115543 A1* | 4/2020 | Yamoto ................ | H05K 1/0326 |
| 2022/0023939 A1 | 1/2022 | Fujii et al. | |
| 2022/0288680 A1* | 9/2022 | Nitanai ................... | B22F 1/052 |
| 2023/0104924 A1* | 4/2023 | Higgs ................... | C23C 14/223 427/248.1 |
| 2024/0006716 A1* | 1/2024 | Takamori .............. | H01G 11/52 |

FOREIGN PATENT DOCUMENTS

| | | |
|---|---|---|
| JP | 2003-257244 A | 9/2003 |
| JP | 2011-100573 A | 5/2011 |
| JP | 2011-238596 A | 11/2011 |
| JP | 2012-230866 A | 11/2012 |
| JP | 2012-253088 A | 12/2012 |
| JP | 2013-142173 A | 7/2013 |
| JP | 2014-080558 A | 5/2014 |
| JP | 2014-235942 A | 12/2014 |
| JP | 2015-014050 A | 1/2015 |
| JP | 2017-076517 A | 4/2017 |
| JP | 2017-101264 A | 6/2017 |
| WO | 2006/057348 A1 | 6/2006 |
| WO | 2019/117234 A1 | 6/2019 |

* cited by examiner

PASTE COMPOSITION AND SEMICONDUCTOR DEVICE

TECHNICAL FIELD

The present disclosure relates to a paste composition and a semiconductor device.

BACKGROUND OF INVENTION

In recent years, the efficiency of semiconductor elements has advanced. With this trend, the amount of heat generated by semiconductor elements has increased, and the operating temperature of semiconductor elements has gone up. In addition, bonding materials need to have reliability and heat dissipation at high temperatures. An example of a candidate for bonding materials includes a solder or a silver paste, both of which have been conventionally used in the related field. However, a solder or a silver paste exhibits insufficient reliability and heat dissipation at high temperatures and are therefore incompatible for applications as a bonding material. As such, there is a demand for the provision of a bonding method suitable for high temperature operations. To meet this demand, people are turning attention to silver sintering pastes that allow for bonding at low temperatures and that use silver nanoparticles with excellent thermal conductivity and electric conductivity. For example, Patent Document 1 discloses a silver paint composition (silver sintering paste) including silver nanoparticles whose surface is coated with a specific protective agent. Patent Document 2 discloses a silver sintering paste including a silver-containing powder (silver nanoparticles) whose surface is coated with a specific surfactant. Patent Document 3 discloses a silver paste including aggregates of fine silver particles that have an average primary particle diameter from 40 nm to 130 nm and that exhibit favorable dispersibility in a desired dispersion solvent by having a changed surface property of fine silver particles.

When a silver sintering paste using silver nanoparticles is heated, a resin included therein is cured and shrunk, resulting in adjacent silver particles or silver compound particles being brought into contact with each other, or the portions in contact being fused together. In this way, the silver sintering paste using silver nanoparticles achieves excellent thermal conductivity and electric conductivity.

When a thermosetting resin included in the silver sintering paste is cured and when the silver particles included in the silver sintering paste are sintered, the thermosetting resin shrinks because of the curing, while the volume of the silver nanoparticles is reduced because protective groups are separated from the silver nanoparticle surface. As such, the paste tends to shrink in volume. For example, Patent Document 3 discloses that the shrinkage rate after pre-drying of a bonding material using the aggregate particles is in a range from 26% to 62%.

CITATION LIST

Patent Literature

Patent Document 1: JP 2013-142173 A

Patent Document 2: WO 2006/057348

Patent Document 3: JP 2017-101264 A

SUMMARY

That is, the present disclosure relates to the following.
1. A paste composition including: silver particles (A), a thermosetting resin (B), a curing agent (C), and a solvent (D). A shrinkage rate after curing of the paste composition is 15% or less.

DESCRIPTION OF EMBODIMENTS

Figure 1:
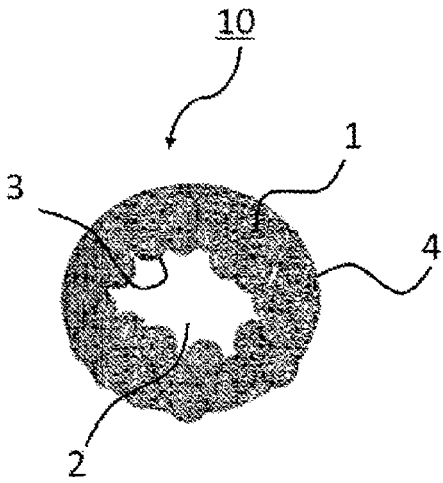
FIG. 1 is a cross-sectional view schematically illustrating a silver particle (A1) according to an embodiment of the present disclosure wherein the silver particle (A1) is a hollow particle.

Hereinafter, the present disclosure will be described in detail with reference to an embodiment.

Paste Composition

In an embodiment of the present disclosure, a paste composition includes silver particles (A), a thermosetting resin (B), a curing agent (C), and a solvent (D). A shrinkage rate after curing of the paste composition is 15% or less.

As described above, a silver sintering paste tends to shrink significantly due to a combination of shrinkage of a thermosetting resin because of curing and shrinkage in volume of silver nanoparticles. During sintering, the silver particles undergo fusion (necking) with adjacent silver particles, and the sintering progresses in a manner that the silver particles aggregate to the center of the paste composition. Thereby, thermal conductivity is exhibited. Thus, the larger the amount of silver nanoparticles compounded, the greater the shrinkage after curing of the paste composition, and the higher the thermal conductivity. As a reaction thereto, a bonding interface with an element to be bonded or with an element support member to be bonded becomes sparse in silver particles, and the ratio of the thermosetting resin increases proportionally. As a result, the bonding strength with an element or with an element support member is increased. However, the thermal resistance of the bonding interface with an element to be bonded or with an element support member to be bonded increases.

The paste composition according to an embodiment of the present disclosure has a shrinkage rate after curing of 15% or less, and thus has a favorable adhesive property, a small thermal resistance of bonding interface, and excellent thermal conductivity and electric conductivity.

When the shrinkage rate after curing (curing shrinkage rate) of the paste composition exceeds 15%, the thermal resistance of a bonding interface may increase during bonding of a substrate and a semiconductor element using the paste composition. From this perspective, the curing shrinkage rate may be 12% or less, or may be 10% or less. As such, when the curing shrinkage rate is 15% or less, the thermal resistance of a bonding interface can be reduced even when an electronic component using the paste composition is subjected to pressureless bonding. With the thermal resistance reduced, a coefficient of thermal conductivity can be maintained even if the amount of silver particles compounded is decreased. As a result, the amount of the thermosetting resin can be increased relatively, improving adhesion.

By using the paste composition according to an embodiment of the present disclosure, the thermal resistance can be made smaller than that of a known product, making it possible to reduce the content of the silver particles (A). Reducing the content of the silver particles (A) makes it possible to reduce the amount of the solvent (D). In particular, voids are reduced in the bonding of chips with a large surface area.

The curing shrinkage rate can be adjusted by suitably selecting a type and a content of the silver particles (A), the thermosetting resin (B), and the solvent (D).

The curing shrinkage rate can be determined by measuring the film thicknesses (µm) of the paste composition before and after curing using a micrometer and calculating based on the following equation, for example. Specifically, the coefficient of thermal conductivity can be measured by the method described in the examples.

$$\text{Curing shrinkage rate (\%)} = \text{Film thickness of paste after curing/Film thickness of paste before curing} \times 100$$

Silver Particles (A)

The silver particles (A) used in an embodiment of the present disclosure are not limited. However, from the perspective of reducing the curing shrinkage rate of the paste composition, the silver particles (A) used in an embodiment of the present disclosure may include silver particles (A1) and/or silver particles (A2), the silver particles (A1) being secondary aggregate particles that have an average particle diameter from 0.5 µm to 2.0 µm and that are aggregates of particles including primary particles having an average particle diameter from 10 nm to 100 nm, the silver particles (A2) being secondary aggregate particles that have an average particle diameter of greater than 2.0 µm and 15.0 µm or less and that are aggregates of particles including primary particles having an average particle diameter of greater than 100 nm and 500 nm or less.

A shape of the silver particles (A) is not limited, and examples thereof include spherical and flake-shaped. The shape of the silver particles (A) may be spherical.

The average particle diameter of the primary particles of the silver particles (A) can be measured in the following manner, and specifically, it can be measured by a method described in Examples.

The silver particles are embedded in an epoxy resin at curing conditions including a temperature of 60° C. for 120 minutes. The resulting product is then subjected to cross-sectional milling using an ion milling device under conditions including an acceleration voltage of 6 kV, a processing mode of C3 (±30°), and a processing time of 30 minutes. The equivalent circle diameters for 200 silver particles are measured by observing the cross sections of the resultant spherical silver particles using a field emission scanning electron microscope (FE-SEM) under conditions including an acceleration voltage of 1.0 kV and a magnification of 10000 to 200000. The equivalent circle diameter of the 200 measured silver particles is determined through image processing using image analysis software, and an average of the 200 measured silver particles.

The average particle diameter of the secondary aggregate particles of the silver particles (A) is a particle diameter (50% particle diameter $D_{50}$) at which the cumulative volume reaches 50% in a particle size distribution measured using a laser diffraction particle size distribution measurement device. Specifically, the average particle diameter of the secondary aggregate particles of the silver particles (A) can be measured by a method described in Examples.

Silver Particles (A1)

The silver particles (A1) are secondary aggregate particles that have an average particle diameter from 0.5 µm to 2.0 µm and that are aggregates of particles including primary particles having an average particle diameter from 10 nm to 100 nm. The silver particles (A1) may be spherical. When the average particle diameter of the primary particles is 10 nm or greater, the specific surface area is not overly large, and workability of the paste composition can be made favorable; meanwhile, when the average particle diameter of the primary particles is 100 nm or less, favorable sinterability can be achieved. From such a perspective, the average particle diameter of the primary particles may be from 10 nm to 50 nm, or may be from 20 nm to 50 nm.

When the average particle diameter of the secondary aggregate particles is 0.5 µm or greater, storage stability is improved; meanwhile, when the average particle diameter of the secondary aggregate particles is 2.0 µm or less, favorable sinterability can be achieved. From such a perspective, the average particle diameter of the secondary aggregate particles may be from 1.0 µm to 2.0 µm.

The silver particles (A1) may be hollow particles. Here, a hollow particle means a particle having a void within the particle. When the silver particles (A1) are hollow particles, the silver particles (A1) have an outer shell formed by particles including aggregated primary particles and a void present inside the outer shell. The void may be present in the center portion of the silver particles (A1). The hollow in such hollow particles is formed during, as shown in Synthesis Examples, the process of aggregation and densification of silver particles which are resulting from the reduction of a silver compound.

The silver particles (A1) may have a porosity before sintering from 20% to 50%, or may have a porosity after sintering from 30% to 60%. The silver particles (A1) may have an outer shell thickness before sintering from 0.05 µm to 0.5 µm, or may have an outer shell thickness after sintering from 0.05 µm to 0.4 µm, or may have a rate of change in outer shell thickness due to sintering from 15% to 50%.

When the porosity before sintering, the porosity after sintering, the outer shell thickness before sintering, the outer shell thickness after sintering, and the rate of change in outer shell thickness due to sintering are each within the corresponding range described above, sintering at the inner side of the highly active silver particles proceeds first during sintering. As such, the volume shrinkage of the paste composition decreases, and the curing shrinkage rate of the paste composition can be reduced. Sintering progresses centering on the inner side of the highly active silver particles, and thus the porosity after sintering is greater than the porosity before sintering. When the porosity before sintering, the porosity after sintering, the outer shell thickness before sintering, the outer shell thickness after sintering, and the rate of change in outer shell thickness due to sintering are each within the corresponding range described above, the silver particles (A1) have a positive thermal expansion coefficient between 150 and 300° C., as will be described later.

From the perspective of further reducing the curing shrinkage rate of the paste composition, the porosity before sintering of the silver particles (A1) may be from 20% to 40%. The porosity after sintering of the silver particles (A1) may be from 30% to 50%. The outer shell thickness before sintering of the silver particles (A1) may be from 0.22 µm to 0.42 µm. The outer shell thickness after sintering of the silver particles (A1) may be from 0.18 µm to 0.35 µm. The rate of change in outer shell thickness due to sintering of the silver particles (A1) may be from 20% to 50%.

Note that in an embodiment of the present disclosure, the porosity after sintering of the silver particles (A1) and the outer shell thickness after sintering of the silver particles (A1) are measured using silver particles that are the product of sintering the silver particles (A1) under conditions including a nitrogen atmosphere, a sintering temperature from 175 to 225° C., and a sintering time from 1 to 3 hours. For example, sintering of the silver particles (A1) may be performed under conditions including a nitrogen atmosphere, a temperature of 190° C., and 2 hours.

The porosity before sintering of the silver particles (A1) and the outer shell thickness before sintering of the silver particles (A1) can be adjusted to within the corresponding range described above by suitably adjusting the average particle diameter of the primary particles of the silver particles (A1). The porosity after sintering of the silver particles (A1) and the outer shell thickness after sintering of the silver particles (A1) can be adjusted to within the corresponding range described above by optimizing the average particle diameter of the primary particles of the silver particles (A1) and the sintering temperature within the corresponding range described above.

Note that the porosity is defined by Equation (1) below based on a total cross-sectional area ($\mu m^2$) of pore portions included in all silver particles in a visual field (total cross-sectional area of pore portions) and a total cross-sectional area ($\mu m^2$) of all silver particles in the visual field (total cross-sectional area) when cross sections of silver particles (A1) cut by an ion milling device are observed with a field emission scanning electron microscope (FE-SEM). Specifically, the porosity can be measured by a method described in Examples.

$$\text{Porosity (\%)} = \text{Total cross-sectional area of pore portions/Total cross-sectional area} \times 100 \quad (1)$$

The rate of change in outer shell thickness due to sintering is defined by Equation (2) below, and specifically, it can be measured by a method described in Examples.

Note that, the outer shell thickness before sintering and the outer shell thickness after sintering are determined as follows. The cross sections of the silver particles (A1) before sintering and the cross sections of the silver particles (A1) after sintering, all cut using an ion milling device, are observed separately with a field emission scanning electron microscope (FE-SEM); then, the individual outer shell thicknesses before and after sintering of 200 silver particles are measured. The equivalent circle diameter of the 200 measured silver particles is determined through image processing using image analysis software, and an average of the 200 measured silver particles.

Rate of change in outer shell thickness due to sintering (%)=$(T_A-T_B)/T_A \times 100$ (2) where $T_A$ is the outer shell thickness ($\mu m$) before sintering and $T_B$ is the outer shell thickness ($\mu m$) after sintering under the sintering conditions described above.

The silver particles (A1) may further have a positive thermal expansion coefficient in a range from 150 to 300° C., which is the firing temperature range. The thermal expansion coefficient of the silver particles (A1) may be from 0.2 ppm/° C. to 10.0 ppm/° C., or may be from 1.5 ppm/° C. to 8.0 ppm/° C.

In an embodiment of the present disclosure, the thermal expansion coefficient of the silver particles (A1) is determined by applying a load of 200 kgf to silver particles of Ag powder for 1 minute using a mini hydraulic press (available from Specac Inc.) to produce a cylindrical pellet-shaped sample having a diameter of 5 mm and a thickness of 1 mm, then heating the produced sample from ambient temperature (25° C.) to 350° C. at a rate of temperature rise of 20° C./minute using a thermomechanical analysis (TMA) device (product name: TMA SS150, available from Seiko Instruments Inc.), and then measuring the thermal expansion. The thermal expansion coefficient when based on the pellet length at 25° C. is adopted as the thermal expansion coefficient between 150 and 300° C., which is the firing temperature range.

The sintering onset temperature of the silver particles having a positive linear expansion coefficient is the temperature at the time at which shrinkage starts, that is, the temperature at the time at which the thermal expansion coefficient is maximized; usually, the temperature sintering onset is within a range from 150 to 300° C.

When the temperature at which the thermal expansion coefficient is exhibited is within the range described above, the outer shell of the silver particles in the paste composition expands during sintering, and as such, chances of contact between silver particles increase, and chances of contact between silver particles and a bonding surface also increase, resulting in a favorable thermal conductivity with the bonding surface and a reduced thermal resistance. As a result, even if the content of the silver particles (A) is relatively small, a thermal resistance more favorable than that of a known example can be produced. Since a favorable thermal resistance can be produced even if the content of silver particles (A) is kept small, the amount of a diluting solvent can be reduced. By reducing the amount of the diluting solvent, a bonding surface with few voids can be produced, and thus thermal conductivity and thermal resistance become favorable.

Although the mechanism regarding silver particles (A1) having a positive linear expansion coefficient is not clear, the present inventors infer as follows based on observation of silver particles subjected to heating. Here, FIG. 1 is a cross-sectional view schematically illustrating a silver particle (A1) according to an embodiment of the present disclosure wherein the silver particle (A1) is a hollow particle, and FIG. 2 is a cross-sectional view schematically illustrating a silver particle (A1) after sintering.

Figure 2:
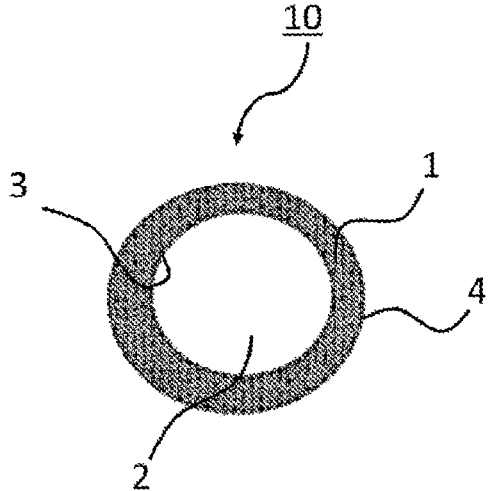
FIG. 2 is a cross-sectional view schematically illustrating a silver particle (A1) after sintering according to an embodiment of the present disclosure wherein the silver particle (A1) is a hollow particle.

As illustrated in FIG. 1, a secondary aggregate particle 10 includes an outer shell 1, in which particles containing primary particles having an average particle diameter from 10 nm to 100 nm are aggregated, and a void 2, which is present inside the outer shell 1. In the secondary aggregate particle 10, necking progresses more easily on an outer side 4 of the outer shell 1 than on an inner side 3 of the outer shell 1, and thus the specific surface area of the inner surface of the outer shell 1 increases. That is, the ratio of the inner periphery to the outer periphery of the silver particles (A1) is large. When such secondary aggregate particle 10 having the void 2 is subjected to sintering, the inner side 3 of the outer shell expands, thereby exerting an outward expanding force. As such, it is inferred that the outer shell 1 of the secondary aggregate particle 10 becomes thin while a positive linear expansion coefficient is achieved, as illustrated in FIG. 2.

The silver particles (A1) may further have a protective organic molecule attached. Examples of the protective organic molecule include a carboxylic acid, an amine, and an amide. From the perspective of increasing the dispersibility of the silver particles (A1), the protective organic molecule may be a carboxylic acid.

From the perspective of sinterability at low temperatures and storage stability, an amount of the protective organic molecule attached with respect to a total amount of the silver particles (A1) may be from 0.15 mass % to 3.0 mass %, or may be from 0.5 mass % to 3.0 mass %, or may be from 1.3 mass % to 3.0 mass %.

Note that the amount of the protective organic molecule attached can be determined, using a thermogravimetry/differential thermal analyzer (TG-DTA), from the amount of mass loss of the silver particles (A1) when the temperature is increased from 230° C. to 320° C. Specifically, the coefficient of thermal conductivity can be measured by the method described in the examples.

The silver particles (A1) may be manufactured by the following method.

Method of Manufacturing Silver Particles (A1)

A method of manufacturing silver particles (A1) includes, for example, a step of preparing a silver ammine complex solution by adding ammonia water to an aqueous solution containing a silver compound; and a step of preparing a silver particle-containing slurry by reducing, with a reducing compound, a silver ammine complex in the silver ammine complex solution prepared in the previous step.

Step of Preparing Silver Ammine Complex Solution

In this step, ammonia water is added to an aqueous solution containing a silver compound, and a silver amine complex solution is prepared.

Examples of the silver compound include silver nitrate, silver chloride, silver acetate, silver oxalate, and silver oxide. From the perspective of solubility in water, the silver compound is preferably silver nitrate or silver acetate.

From the perspective of keeping the average particle diameter of the primary particles (primary particle diameter) of the silver particles (A1) within the range described above, and from the perspective of keeping each of the porosity before sintering, the porosity after sintering, the outer shell thickness before sintering, the outer shell thickness after sintering, and the rate of change in outer shell thickness due to sintering within the corresponding range described above, an amount of ammonia compounded may be from 2 mol to 50 mol, or may be from 5 mol to 50 mol, or may be from 10 mol to 50 mol, per 1 mol of silver in the aqueous solution containing a silver compound. When the amount of ammonia added is 2 mol or greater per 1 mol of silver, the primary particle diameter and the porosity are not overly small; meanwhile, when the amount of ammonia added is 50 mol or less per 1 mol of silver, the primary particle diameter and the porosity are not overly large.

The present inventors infer that in an embodiment of the present disclosure, the following mechanism works for the silver particles (A1) being hollow particles: when the silver ammine complexes are reduced at a low temperature, silver particles precipitate and nitrogen-containing compounds diffuse, causing the precipitated silver particles to diffuse relatively inward to form weak aggregates, thereby forming a hollow structure inside the silver particles. Thus, the hollow particles do not necessarily have a completely enclosed space, but are substantially spherical and have a structure in which a space is present at the center portion.

Step of Preparing Silver Particle-containing Slurry

In this step, the silver ammine complex contained in the silver ammine complex solution prepared in the step described above is reduced by a reducing compound, and a silver particle-containing slurry is prepared.

Aggregation of the primary particles can be controlled by suitably adjusting the amount of silver in the silver ammine complex and the content of the reducing compound, and thereby the average particle diameter of the produced secondary aggregate particles can be kept within the range described above.

The reducing compound is not particularly limited as long as the reducing compound can reduce the silver ammine complex and cause the silver to precipitate. A redox potential of the reducing compound may be 1 V or greater. Examples of such reducing compound include a hydrazine derivative.

By using a hydrazine derivative with a strong reducing power as the reducing compound, the primary particles of the silver particles in the silver ammine complex aggregates, making it easier to form the secondary aggregate particles having a void at the center.

Examples of the hydrazine derivative include hydrazine monohydrate, methylhydrazine, ethylhydrazine, n-propylhydrazine, i-propylhydrazine, n-butylhydrazine, i-butylhydrazine, sec-butylhydrazine, t-butylhydrazine, n-pentylhydrazine, i-pentylhydrazine, neo-pentylhydrazine, t-pentylhydrazine, n-hexylhydrazine, i-hexylhydrazine, n-heptylhydrazine, n-octylhydrazine, n-nonylhydrazine, n-decylhydrazine, n-undecylhydrazine, n-dodecylhydrazine, cyclohexylhydrazine, phenylhydrazine, 4-methylphenylhydrazine, benzylhydrazine, 2-phenylethylhydrazine, 2-hydrazinoethanol, and acetohydrazine. These may be used alone or in combination of two or more.

Since the hydrazine derivative has a strong reducing power, fine silver particles with high crystallinity and orientation can be produced.

From the perspective of keeping the primary particle diameter within the range described above, and from the perspective of keeping each of the porosity before sintering, the porosity after sintering, the outer shell thickness before sintering, the outer shell thickness after sintering, and the rate of change in outer shell thickness due to sintering within the corresponding range described above, an amount of the reducing compound compounded may be from 0.25 mol to 20.0 mol, or may be from 0.25 mol to 10.0 mol, or may be from 1.0 mol to 5.0 mol, per 1 mol of silver in the silver ammine complex. When the content of the reducing compound is 0.25 mol or greater per 1 mol of silver in the silver ammine complex, the primary particle diameter and the porosity are not overly small; meanwhile, when the content of the reducing compound is 20 mol or less per 1 mol of silver in the silver ammine complex, the primary particle diameter and the porosity are not overly large.

A temperature of the silver ammine complex solution when reducing the silver amine complex may be lower than 30° C., or may be 0° C. or higher and lower than 20° C., or may be 0° C. or higher and lower than 10° C. When the temperature of the silver ammine complex solution is within this range, the aggregation of the primary particles is controlled, and the average particle diameter of the resulting secondary aggregate particles is within the range described above. By reducing the silver compound with a hydrazine derivative having a strong reducing power at a relatively low temperature, a desired hollow structure of the secondary aggregate particles can be formed.

Step of Attaching Protective Organic Molecule to Silver Particles

The method of manufacturing silver particles (A1) may further include, after the step of preparing the silver particle-containing slurry, a step of attaching a protective organic molecule onto the silver particles by adding a protective organic molecule to the silver particle-containing slurry prepared in the aforementioned step.

Examples of the protective organic molecule include a carboxylic acid, an amine, and an amide. From the perspective of increasing dispersibility, the protective organic molecule is preferably a carboxylic acid.

Examples of the carboxylic acid include monocarboxylic acids, such as formic acid, acetic acid, propionic acid, butyric acid, valeric acid, caproic acid, caprylic acid, octylic acid, nonanoic acid, capric acid, oleic acid, stearic acid, and isostearic acid; dicarboxylic acids, such as oxalic acid, malonic acid, succinic acid, glutaric acid, adipic acid, pimelic acid, suberic acid, azelaic acid, sebacic acid, and diglycolic acid; aromatic carboxylic acids, such as benzoic acid, phthalic acid, isophthalic acid, terephthalic acid, salicylic acid, and gallic acid; and hydroxy acids, such as glycolic acid, lactic acid, tartronic acid, malic acid, glyceric acid, hydroxybutyric acid, tartaric acid, citric acid, and isocitric acid.

From the perspective of keeping the primary particle diameter within the range described above, and from the perspective of keeping each of the porosity before sintering, the porosity after sintering, the outer shell thickness before sintering, the outer shell thickness after sintering, and the rate of change in outer shell thickness due to sintering within the corresponding range described above, an amount of the protective organic molecule compounded may be from 1 mmol to 20 mmol, or may be from 1 mmol to 10 mmol, or may be from 1 mmol to 5 mmol, per 1 mol of silver particles. When the amount of protective organic molecule compounded is 1 mmol or greater, the primary particle diameter and the porosity are not overly small; meanwhile, when the amount of protective organic molecule compounded is 20 mmol or less, the primary particle diameter and the porosity are not overly large.

Silver Particles (A2)

The silver particles (A2) are secondary aggregate particles that have an average particle diameter of greater than 2.0 μm and 15.0 μm or less and that are aggregates of particles including primary particles having an average particle diameter of greater than 100 nm and 500 nm or less. When the average particle diameter of the primary particles is greater than 100 nm, the specific surface area is not overly large, and the workability of the paste composition can be made favorable; meanwhile, when the average particle diameter is 500 nm or less, favorable sinterability can be achieved. From such a perspective, the average particle diameter of the primary particles may be from 150 nm to 500 nm, or may be from 200 nm to 400 nm.

When the average particle diameter of the secondary aggregate particles is greater than 2.0 μm, the specific surface area is not overly large, and the viscosity of the paste composition is at a suitable value, giving the paste composition a favorable workability; meanwhile, when the average particle diameter of the secondary aggregate particles is 15.0 μm or less, the occurrence of bleeding of the paste composition can be controlled, and the paste composition can have favorable dispensability, also giving the paste composition a favorable workability. From such a perspective, the average particle diameter of the secondary aggregate particles may be from 3.0 μm to 15.0 μm, or may be from 3.0 μm to 12.0 μm.

The silver particles (A2) may be solid particles. Here, a solid particle means a particle that is substantially free of a space inside the particle.

The silver particles (A2) may be manufactured using the same method for manufacturing the silver particles (A1), namely, by preparing a silver ammine complex solution and then adding a reducing compound to reduce the silver ammine complex in the solution. After reducing the silver amine complex, a protective organic molecule may be added to the produced silver particle-containing slurry to attach the protective organic molecule to the silver particles. Specifically, the silver particles (A2) can be manufactured by a method described in Examples.

The reducing agent is not limited, but for example, the use of sodium borohydride, lithium aluminum hydride, or the like facilitates the formation of solid particles. These may be used alone or in combination of two or more.

In the manufacturing of the silver particles (A2), the average particle diameter of the primary particles and the average particle diameter of the secondary aggregate particles can be kept within the ranges described above by suitably adjusting an amount of silver in the silver amine complex, an amount of ammonia used, an amount of the reducing agent, and an amount of the protective organic molecule.

The amount of ammonia compounded may be from 2 mol to 50 mol, or may be from 5 mol to 50 mol, or may be from 10 mol to 50 mol, per 1 mol of silver in the aqueous solution containing a silver compound.

The amount of the reducing agent compounded may be from 0.25 mol to 20 mol, or may be from 0.25 mol to 10 mol, or may be from 1 mol to 5 mol, per 1 mol of silver in the silver ammine complex.

The amount of the protective organic molecule compounded may be from 1 mmol to 20 mmol, or from 1 mmol to 10 mmol, or from 1 mmol to 5 mmol, per 1 mol of silver particles.

From the perspective of reducing the curing shrinkage rate of the paste composition, a total content of the silver particles (A1) and the silver particles (A2) included in the silver particles (A) may be from 40 mass % to 100 mass %, or from 50 mass % to 100 mass %.

In an embodiment of the present disclosure, the silver particles (A) may include silver particles in addition to the silver particles (A1) and the silver particles (A2). When the silver particles (A) include silver particles in addition to the silver particles (A1) and the silver particles (A2), a content of the additional silver particles may be 60 mass % or less, or 50 mass % or less, relative to the total amount of silver particles (A).

From the perspective of dispersibility, a tap density of the silver particles (A) may be from 0.5 g/cm$^3$ to 7.0 g/cm$^3$, or may be from 2.0 g/cm$^3$ to 7.0 g/cm$^3$, or may be from 4.0 g/cm$^3$ to 7.0 g/cm$^3$, or may be from 4.5 g/cm$^3$ to 7.0 g/cm$^3$, or may be from 4.5 g/cm$^3$ to 6.5 g/cm$^3$. The tap density of the silver particles (A) can be measured using a tap density measuring device in accordance with the ASTM standard test method B 527, and specifically can be measured by a method described in Examples.

From the perspective of sinterability, a specific surface area of the silver particles (A) calculated in accordance with the BET method may be from 0.5 m$^2$/g to 2.5 m$^2$/g, or from 0.5 m$^2$/g to 1.5 m$^2$/g, or from 0.5 m$^2$/g to 1.2 m$^2$/g, or from 0.6 m$^2$/g to 1.2 m$^2$/g.

The specific surface area of the silver particles (A) can be measured in accordance with the single point BET method through nitrogen adsorption using a specific surface area measuring device, and specifically can be measured by a method described in Examples.

The content of the silver particles (A) with respect to the total amount of the paste composition may be from 70 mass % to 98 mass %, or may be from 75 mass % to 95 mass %. When the content of the silver particles (A) is 70 mass % or greater, the coefficient of thermal conductivity can be improved; meanwhile, when the content of the silver particles (A) is 95 mass % or less, adhesive strength can be improved.

Thermosetting Resin (B)

The thermosetting resin (B) used in an embodiment of the present disclosure is not limited as long as it has a positive curing shrinkage rate. However, from the perspective of thermal adhesive strength, the thermosetting resin (B) may be a flexible epoxy resin that is in liquid form at ambient temperature (25° C.) (hereinafter, also referred to as a liquid flexible epoxy resin). The use of a flexible epoxy resin as the thermosetting resin (B) can reduce the curing shrinkage rate of the paste composition.

In an embodiment of the present disclosure, the flexible epoxy resin refers to an epoxy resin that, when cured with a stoichiometric amount of diethylenetriamine ("DETA"), has a durometer hardness of 30 or less as measured by a Type D durometer, or has an elastic modulus after curing of 2 GPa or less.

The liquid flexible epoxy resin is not limited as long as it has two or more epoxy groups in one molecule and exhibits flexibility. Examples of the liquid flexible epoxy resin include: a diglycidyl ether of polyethylene glycol, a diglycidyl ether of polypropylene glycol, and a polyglycidyl ether of a long-chain polyol including a polyoxyalkylene glycol, a polytetramethylene ether glycol, and the like containing an alkylene group having from 2 to 9 carbons (preferably from 2 to 4 carbons); a copolymer of glycidyl (meth)acrylate and a radical-polymerizable monomer such as ethylene, vinyl acetate or a (meth)acrylic acid ester; a (co)polymer of a conjugated diene compound or a (co)polymer of a partially hydrogenated product thereof in which an unsaturated carbon bond is epoxidized; a polyester resin having an epoxy group; a urethane-modified epoxy with an urethane bond or a polycaprolactone bond introduced; a polycaprolactone-modified epoxy resin; a dimer acid-modified epoxy resin in which an epoxy group is introduced into the molecule of dimer acid or a derivative thereof; and a rubber-modified epoxy resin in which an epoxy group is introduced into the molecule of a rubber component, such as nitrile rubber (NBR), carboxy-terminated butadiene nitrile rubber (CTBN), polybutadiene, and acrylic rubber. These may be used alone or in combination of two or more.

From the perspective of reducing voids at the bonding interface, the liquid flexible epoxy resin may have a durometer hardness after curing, measured by a Type D durometer, from 10 to 30.

From the perspective of reducing voids at the bonding interface, the liquid flexible epoxy resin may have an elastic modulus after curing of 1 GPa or less, or 0.5 GPa or less.

The elastic modulus can be measured by a dynamic viscoelasticity measuring device, and specifically can be measured by a method described in Examples.

From the perspective of reducing the curing shrinkage rate of the paste composition, the liquid flexible epoxy resin may have an epoxy equivalent weight from 200 to 2000, or from 300 to 1800.

Specific examples of the liquid flexible epoxy resin include YX7105 (available from Mitsubishi Chemical Corporation, product name), YX7110 (available from Mitsubishi Chemical Corporation, product name), YL7410 (available from Mitsubishi Chemical Corporation, product name), EP-40035 (available from ADEKA Corporation, product name), EP-40005 (available from ADEKA Corporation, product name), TSR-960 (available from DIC Corporation, product name), TSR-601 (available from DIC Corporation, product name), 1650-75MPX (available from DIC Corporation, product name), EXA-4850-150 (available from DIC Corporation, product name), EXA-4850-1000 (available from DIC Corporation, product name), EXA-4816 (available from DIC Corporation, product name), EXA-4822 (available from DIC Corporation, product name), BPO-20E (available from New Japan Chemical Co., Ltd., product name), and BEO-60E (available from New Japan Chemical Co., Ltd., product name).

From the perspective of the balance between adhesiveness and thermal conductivity, an amount of the thermosetting resin (B) compounded with respect to the total amount of the paste composition may be from 1 mass % to 20 mass %, or may be from 2 mass % to 15 mass %.

Curing Agent (C)

The curing agent (C) used in an embodiment of the present disclosure can be any as long as it can serve as a curing agent for the thermosetting resin (B). Examples of the curing agent (C) include a phenol resin, dicyandiamide, an amine compound, a latent amine compound, a cationic compound, an acid anhydride, and a special epoxy curing agent. These may be used alone or in combination of two or more.

From the perspective of thermal resistance, the curing agent (C) may be a phenol resin (C1); meanwhile, from the perspective of thermal adhesive strength, the curing agent (C) may be dicyandiamide (C2).

Examples of the phenol resin (C1) include bisphenols, such as bisphenol F, bisphenol A, bisphenol S, tetramethyl bisphenol A, tetramethyl bisphenol F, tetramethyl bisphenol S, dihydroxydiphenyl ether, dihydroxybenzophenone, tetramethylbiphenol, ethylidenebisphenol, methyl ethylidene bis(methylphenol), cyclohexylidene bisphenol, biphenol, and derivatives thereof; trifunctional phenols, such as tri(hydroxyphenyl)methane and tri(hydroxyphenyl)ethane, and derivatives thereof; and compounds resulting from a reaction of a phenol such as phenol novolac or cresol novolac with formaldehyde, and that are mainly composed of dinuclear or trinuclear bodies, as well as derivatives of such compounds. These may be used alone or in combination of two or more.

An amount of the phenol resin (C1) compounded may be from 1 part by mass to 100 parts by mass, or may be from 1 part by mass to 50 parts by mass, per 100 parts by mass of the thermosetting resin (B).

Examples of commercially available products of the dicyandiamide (C2) include DICY-7 (available from Japan Epoxy Resin Co., Ltd., product name).

An amount of the dicyandiamide (C2) compounded may be from 0.5 part by mass to 5 parts by mass, per 100 parts by mass of the thermosetting resin (B).

From the perspective of curability and adhesiveness, the curing agent (C) may be a combination of the phenol resin (C1) and the dicyandiamide (C2).

When the curing agent (C) is a combination of the phenol resin (C1) and the dicyandiamide (C2), the amount of the phenol resin (C1) compounded may be from 1 part by mass to 10 parts by mass, or may be from 2 part by mass to 8 parts by mass, per 100 parts by mass of the thermosetting resin (B). The amount of the dicyandiamide (C2) compounded may be from 0.5 part by mass to 5 parts by mass, or may be from 0.6 parts by mass to 3 parts by mass, per 100 parts by mass of the thermosetting resin (B).

A mass ratio [(C1):(C2)] of the phenol resin (C1) to the dicyandiamide (C2) may be from 1:1 to 10:1, or may be from 1:1 to 8:1.

From the perspective of, for example, the balance between curability and a physical property of the cured resin, an amount of the curing agent (C) compounded may be from 0.5 equivalent amount to 1.5 equivalent amount in terms of an equivalent ratio with respect to the thermosetting resin (B).

The amount of the curing agent (C) compounded with respect to the total amount of the paste composition may be from 0.1 mass % to 1.5 mass %, or may be from 0.2 mass % to 1.0 mass %.

Solvent (D)

The solvent (D) used in an embodiment of the present disclosure is not limited. However, from the perspective of low thermal resistance, the solvent (D) may contain a solvent having a solubility parameter (SP value) of 11 or more, or may contain a solvent having a solubility parameter (SP value) from 11 to 14. The solubility parameter (SP value) is a value defined by the regular solution theory introduced by Hildebrand, and for example, the smaller the difference between the solubility parameters (SP values) of two components, the greater the solubility.

When the solvent (D) contains a solvent having an SP value of 11 or greater, wettability at an interface deteriorates, but thermal resistance of a bonding interface decreases because of the decreased number of voids at the bonding interface. When the solvent (D) contains a solvent having an SP value within the range described above, and in a case in which a liquid flexible epoxy resin is used as the thermosetting resin (B), the liquid flexible epoxy resin has a SP value in a range of 8 or greater to less than 11; as such, the affinity between the liquid flexible epoxy resin and the solvent (D) is reduced, and the solvent (D) is less likely to remain in the system, thereby controlling the generation of voids and reducing thermal resistance. From the perspective of controlling voids and reducing thermal resistance, a difference between the SP values of the thermosetting resin (B) and the solvent (D) may be greater than 2.

The reason why the thermal resistance of a bonding interface is reduced when the solvent (D) contains a solvent having an SP value within the range described above is inferred as follows. The solvent has a large surface energy, thus improving the binding property to the silver particles (A) and the bonding interface. It is inferred that the larger the SP value, the more unstable the energy becomes, and the more effectively the high energy state acts on the interface.

Examples of solvents having a solubility parameter of 11 or greater include ethylene glycol monomethyl ether ($\delta$=11.4), 1-butanol ($\delta$=11.4), 2-propanol ($\delta$=11.5), acetonitrile ($\delta$=11.9), dimethyl sulfoxide ($\delta$=12.0), dimethylformamide ($\delta$=12.1), ethanol ($\delta$=12.7), phenoxyethanol ($\delta$=11.8), benzyl alcohol ($\delta$=12.8), 1,6-cyclohexanedimethanol ($\delta$=13.83), and ethylene glycol ($\delta$=14.2). The solubility parameter of such a solvent is disclosed in, for example, "A. F. M. Burton, Chemical Reviews, 1975, Vol. 75, No. 6, p 731-753".

The solvent (D) may be phenoxyethanol, benzyl alcohol, 1,6-cyclohexanedimethanol, or ethylene glycol.

In an embodiment of the present disclosure, these solvents listed as examples may be used alone, or two or more of them may be used in combination. The reduction of voids at a bonding interface and the reduction of the thermal resistance can be achieved by keeping the SP value of at least one type of the solvents, not the SP value of the mixed solvent, within the range described above.

Examples of the solvent (D) that is a solvent other than the solvents having a SP value that satisfies the range described above include diethylene glycol monobutyl ether ($\delta$=8.5), propylene glycol diacetate ($\delta$=9.6), dipropylene glycol methyl-n-propyl ether ($\delta$=8.0), dipropylene glycol methyl ether acetate ($\delta$=8.7), 1,4-butanediol diacetate ($\delta$=9.6), 1,3-butylene glycol diacetate ($\delta$=9.5), 1,6-hexanediol diacetate ($\delta$=9.5), diethylene glycol monoethyl ether ($\delta$=10.9), dipropylene glycol n-propyl ether ($\delta$=9.5), dipropylene glycol n-butyl ether ($\delta$=9.4), tripropylene glycol methyl ether ($\delta$=9.4), and tripropylene glycol n-butyl ether ($\delta$=9.3).

From the viewpoint of reducing the silver oxide on the surface of the silver particles and improving the sinterability of the silver particles, the solvent (D), in addition to having an SP value within the range described above, may further include a primary alcohol having a flash point of 90° C. or higher. When the solvent (D) includes the primary alcohol, a content of the primary alcohol may be from 5 mass % to 50 mass %, or may be from 10 mass % to 40 mass %.

From the perspective of the coatability of the paste composition and void control, a content of the solvent (D) with respect to the total amount of the paste composition may be from 0.5 mass % to 8.5 mass %, or may be from 2.0 mass % to 8.0 mass %.

In addition to the components described above, the paste composition according to an embodiment of the present disclosure can contain, as necessary, other additives that are generally compounded in this type of composition, examples of the other additives including curing accelerators; stress-lowering agents, such as rubber or silicone; coupling agents; antifoaming agents; surfactants; coloring agents such as pigments or dyes; polymerization initiators; various polymerization inhibitors; and antioxidants. Each of these additives may be used alone, or two or more may be mixed and used.

In the paste composition according to an embodiment of the present disclosure, a total content of the silver particles (A), the thermosetting resin (B), the curing agent (C), and the solvent (D) may be 80 mass % or greater, or may be 90 mass % or greater, or may be 95 mass % or greater.

The paste composition according to an embodiment of the present disclosure can be prepared by thoroughly mixing the silver particles (A), the thermosetting resin (B), the curing agent (C), the solvent (D), and various additives included as necessary, and then kneading the mixture using a device such as a disperser, a kneader, and a 3-roll mill, and subsequently defoaming the mixture.

A coefficient of thermal conductivity of a cured product of the paste composition according to an embodiment of the present disclosure may be 30 W/m·K or greater, or may be 35 W/m·K or greater.

The coefficient of thermal conductivity can be measured by a method described in Examples.

A thermal resistance of a cured product of the paste composition according to an embodiment of the present disclosure may be 0.4 K/W or less, or may be 0.3 K/W or less.

The thermal resistance can be measured by a method described in Examples.

The paste composition according to an embodiment of the present disclosure has a favorable adhesive property, a small thermal resistance of bonding interface, and can yield a cured product having excellent thermal conductivity and electric conductivity. As such, the paste composition according to an embodiment of the present disclosure can be used, for example, as a die attach material for element adhesion or as a material for adhering a heat-dissipating member.

Semiconductor Device

In an embodiment of the present disclosure, a semiconductor device includes a semiconductor element and a substrate. The semiconductor element is adhered to a substrate through a die attach material made of the paste composition described above. Therefore, the semiconductor device according to an embodiment of the present disclosure has excellent reliability.

The semiconductor element may be any known semiconductor element, and examples thereof include transistors and diodes. Examples of the semiconductor element include a light-emitting element such as an LED. The type of light-emitting element is not particularly limited, and examples thereof include those in which a nitride semiconductor, such as InN, AlN, GaN, InGaN, AlGaN, or InGaAlN is formed as a light-emitting layer on a substrate by a method such as the MOBVC method.

Examples of an element support member include a support member formed of a material such as copper, silver-plated copper, a pre-plated lead frame (PPF), glass epoxy, and ceramic.

EXAMPLES

The present disclosure will be specifically described through examples; however, the present disclosure is not limited in any way to these examples.
Production of Silver Particles

Synthesis Example 1

A silver nitrate aqueous solution was prepared by dissolving 40 g of silver nitrate in 10 L of ion-exchanged water, after which 203 mL of ammonia water having a concentration of 26 mass % was added to the silver nitrate aqueous solution, and the mixture was stirred, and thereby a silver ammine complex aqueous solution was produced. This aqueous solution was brought to a liquid temperature of 10° C., and 28 mL of a 20 mass % aqueous solution of hydrazine monohydrate was added dropwise over a period of 60 seconds while stirring to precipitate silver particles, and a silver particle-containing slurry was produced. Next, oleic acid was added into this slurry at an amount of 1 mass % relative to the amount of silver, and the mixture was stirred for 10 minutes. The slurry was then filtered, and the filtered product was washed with water, washed with methanol, and then dried in a vacuum atmosphere at 60° C. for 24 hours, resulting in silver particles having an average particle diameter of primary particles of 20 nm, an average particle diameter of secondary aggregate particles of 1.1 μm, a tap density of 5.2 g/cm³, a specific surface area of 1.2 m²/g, and an amount of oleic acid attached of 2.1 mass %.

Note that the resulting silver particles had a porosity of 25% as measured by a method described below, confirming that the resulting silver particles were hollow particles having a void with a porosity of 25% at the center and an outer shell thickness of 0.275 μm. The silver particles after sintering at 190° C. for 2 hours had a porosity of 43%, an outer shell thickness of 0.189 μm, and a rate of change in outer shell thickness due to sintering of 31%.

Synthesis Example 2

50 g of silver nitrate was dissolved in 0.5 L of ion-exchanged water, resulting in a silver nitrate aqueous solution. Then, 0.5 L of ammonia water having a concentration of 26 mass % was added to the silver nitrate aqueous solution, and the mixture was stirred, resulting in a silver ammine complex aqueous solution. This aqueous solution was brought to a liquid temperature of 10° C., and mixed with 1 L of sodium borohydride aqueous solution (35 g of sodium borohydride dissolved in 1 L of ion-exchanged water) while stirring to precipitate silver particles, resulting in a silver particle-containing slurry. Next, oleic acid was added into this slurry at an amount of 1 mass % relative to the amount of silver, and the mixture was stirred for 10 minutes. The slurry was then filtered, and the filtered product was washed with water, washed with methanol, and then dried in a vacuum atmosphere at 60° C. for 24 hours, resulting in silver particles having an average particle diameter of primary particles of 200 nm, an average particle diameter of secondary aggregate particles of 5.0 μm, a tap density of 0.75 g/cm³, a specific surface area of 2.0 m²/g, and an amount of oleic acid attached of 0.5 mass %.

Examples 1 to 6, Comparative Examples 1 and 2

The various components were mixed according to the formulations in Table 1 and kneaded in a three-roll mill, resulting in paste compositions. The resultant paste compositions were evaluated by the methods described below. The results are shown in Table 1.

Note that, the materials listed in Table 1 and used in the Examples and Comparative Examples are as follows.
Silver Particles (A)

Silver particles 1 (A1): Silver particles of Synthesis Example 1 (average particle diameter of primary particles: 20 nm, average particle diameter of secondary aggregate particles: 1.1 μm, porosity: 25%, outer shell thickness: 0.27 μm, maximum linear expansion coefficient: +5.5 ppm/° C., tap density: 5.2 g/cm³, specific surface area: 1.2 m²/g)

Silver particles 2 (A2): Silver particles of Synthesis Example 2 (average particle diameter of primary particles: 200 nm, average particle diameter of secondary aggregate particles: 5.0 μm, porosity: 0%, maximum linear expansion coefficient: −0.6 ppm/° C., tap density: 0.75 g/cm³, specific surface area: 2.0 m²/g)

Silver particles 3: DOWA Ag nano powder (product name, available from DOWA Electronics Materials Co., Ltd., average particle diameter: 20 nm, porosity: 0%, maximum linear expansion coefficient: −0.1 ppm/° C.)

Silver particles 4: TC-505C (product name, available from Tokuriki Honten Co., Ltd., average particle diameter: 1.93 μm, porosity: 0%, maximum thermal expansion coefficient: −0.1 ppm/° C., tap density: 6.25 g/cm³, specific surface area: 0.65 m²/g)

Thermosetting Resin (B)

Flexible epoxy resin 1: YX7105 (product name, available from Mitsubishi Chemical Corporation, elastic modulus at 25° C.: 0.033 GPa, epoxy equivalent weight: 480, SP value: 9.4)

Flexible epoxy resin 2: YX7110 (product name, available from Mitsubishi Chemical Corporation, elastic modulus at 25° C.: 0.028 GPa, epoxy equivalent weight: 1100, SP value: 9.4)

Epoxy resin 1: YL980 (product name, available from Mitsubishi Chemical Corporation, elastic modulus at 25° C.: 2.5 GPa, epoxy equivalent weight: 190, SP value: 9.8)

The elastic modulus at 25° C. of the thermosetting resin (B) was measured by curing a thermosetting resin at 200° C. for 2 hours, preparing a sample that was cut to a size of 55 cm long×1 cm wide×20 μm thick, and increasing the temperature of the sample by 10° C. per minute from −50° C. to 300° C. using a thermomechanical analysis device (available from Seiko Instruments Inc., device name: DMA).

Curing Agent (C)

Phenol resin (C1): bisphenol F (product name, available from Honshu Chemical Industry Co., Ltd.)

Dicyandiamide (C2), DICY-7 (product name, available from Japan Epoxy Resin Co., Ltd.)

Solvent (D)

Solvent 1: Hisolve EPH (product name, available from Toho Chemical Industry Co., Ltd., SP value: 11.8, flash point: 135° C.)

Solvent 2: Butylcarbitol (product name, available from Kanto Chemical Co., Inc., SP value: 8.5, flash point: 78° C.)

Solvent 3: Ethylene glycol (product name, available from Kanto Chemical Co., Inc., SP value: 14.2, flash point: 111° C.)

Note that the SP value of the thermosetting resin (B) and the SP value of the solvent (D) are both values disclosed in "A. F. M. Burton, Chemical Reviews, 1975, Vol. 75, No. 6, p 731-753".

The silver particles (A) were evaluated by the following methods.

Average Particle Size of Primary Particles

The average particle diameter of the primary particles was measured as follows using the silver particles 1 and silver particles 2 produced in each of the Synthesis Examples above.

The silver particles were embedded in EpoHeat CLR (available from Buehler Ltd.) at curing conditions including a temperature of 60° C. for 120 minutes. The resulting product was then subjected to cross-sectional milling using an ion milling device (ArBlade 5000 available from Hitachi High-Tech Corporation) under conditions including an acceleration voltage of 6 kV, a processing mode of C3 (±30°), and a processing time of 30 minutes. The equivalent circle diameters of 200 silver particles were measured by observing the cross sections of the resultant spherical silver particles using a field emission scanning electron microscope (FE-SEM) (JSM-6700F, available from JEOL, Ltd.) under conditions including an acceleration voltage of 1.0 kV and a magnification of 10000 to 200000. The equivalent circle diameter of the 200 measured silver particles was determined through image processing using the image analysis software ImageJ (available from the National Institutes of Health), and an average of the 200 measured silver particles.

Average Particle Diameter of Secondary Aggregate Particles

The average particle diameter of the secondary aggregate particles of silver particles 1 and the average particle diameter of the secondary aggregate particles of silver particles 2 were determined from the particle diameter at which the cumulative volume was 50% in a particle size distribution (50% particle diameter D50) measured using a laser diffraction-type particle size distribution measurement device (product name: SALAD-7500nano, available from Shimadzu Corporation).

Amount of Protective Organic Molecule Attached

The amount of protective organic molecule attached to the silver particles 1 and the silver particle 2 was measured as follows. Using a thermogravimetry/differential thermal analyzer (TG-DTA) (available from Seiko Instruments Inc., product name: TG/DTA6200), the temperature of 20 mg of silver particles were increased from 230° C. to 320° C. at a rate of 10° C./min in a nitrogen atmosphere. The amount of mass loss of the silver particles was measured, and this value was taken as the amount of protective organic molecule attached.

Thermal Expansion Coefficient

The thermal expansion coefficient of the silver particles 1 to 4 was measured in accordance with the following procedure.

A cylindrical pellet-shaped sample having a diameter of 5 mm and a thickness of 1 mm was prepared by applying a load of 200 kgf to the silver particles for 1 minute using a mini hydraulic press (available from produced by Specac Inc.). The thermal expansion coefficient of the sample was measured using a thermomechanical analysis (TMA) device (product name: TMA SS150, available from Seiko Instruments Inc.) under conditions that included increasing the temperature of the sample from ambient temperature (25° C.) to 350° C. at a rate of temperature rise of 20° C./minute. The thermal expansion coefficient was determined based on the pellet length at 25° C., and the thermal expansion coefficient that became a maximum in a temperature range from 150 to 300° C., which is the firing temperature range, was used as the maximum thermal expansion coefficient.

Tap Density

The tap density of the silver particles 1, 2, and 4 was measured in accordance with the following procedure.

The tap density (TD) was measured as the mass per unit volume (units: $g/cm^3$) of silver particles in a vibrated container using a tap density measuring instrument (Tap-Pak Volumeter, available from Thermo Scientific) on the basis of the ASTM standard test method B 527.

Specific Surface Area

The specific surface area of the silver particles 1, 2, and 4 was measured in accordance with the following procedure.

The silver particles were degassed for 10 minutes at 60° C., and then the specific surface area was measured by the single point BET method through nitrogen adsorption using a specific surface area measuring device (Monosorb, available from Quantachrome Corporation).

Porosity

The porosity before sintering of the silver particles 1 to 4 and the porosity after sintering of the silver particles 1 to 4 were measured in accordance with the following procedure. Silver particles were subjected to cross-sectional milling in the same manner as in the evaluation method of the average particle diameter of primary particles, resulting in a sample for measuring porosity before sintering (Sample 1). Sample 1 was then sintered at 190° C. for 2 hours in a nitrogen atmosphere, resulting in a sample for measuring porosity after sintering (Sample 2). The number of visual fields captured for FE-SEM images by a field emission scanning electron microscope (FE-SEM) (JSM-6700F available from JEOL, Ltd.) was set to 10 $\mu m \times 10$ $\mu m$ to include 300 or more silver particles from the cross section of each of Sample 1 and Sample 2, and FE-SEM images were captured. Next, the cross-sectional areas of pores and the total cross-sectional area of the silver particles including the pores in the FE-SEM images of the silver particles were measured using Mac-View (available from Mountech Co., Ltd.), which is image analysis-type particle size distribution measurement software. Based on the measurement results, the total cross-sectional area ($\mu m^2$) of pore portions included in all silver particles in the visual field (total cross-sectional area of pore portions) and the total cross-sectional area ($\mu m^2$) of all silver particles in the visual field (total cross-sectional area) were determined, and the porosity before sintering and the porosity after sintering were calculated based on Equation (1) below.

$$\text{Porosity (\%)} = \text{Total cross-sectional area of pore portions/Total cross-sectional area} \times 100 \quad (1)$$

Outer Shell Thickness of Silver Particles

The outer shell thickness before sintering of the silver particles 1 and the outer shell thickness after sintering of the silver particles 1 were measured in accordance with the following procedure.

The individual outer shell thicknesses of 200 silver particles were measured using two separate images, the FE-SEM image of sample 1 of the silver particles 1 and the FE-SEM image of sample 2 of the silver particles 1, both images resulting from the measurement of porosity. The outer shell thickness of silver particles was calculated by averaging the measured individual outer shell thicknesses of the 200 silver particles.

Rate of Change in Outer Shell Thickness Due to Sintering

The rate of change in outer shell thickness due to sintering was calculated from the outer shell thickness before sintering and the outer shell thickness after sintering, both resulting from the measurement of the outer shell thickness of silver particles, in accordance with Equation (2) below.

$$\text{Rate of change in outer shell thickness due to sintering (\%)} = (T_A - T_B)/T_A \times 100 \tag{2}$$

where $T_A$ is the outer shell thickness (μm) before sintering and $T_B$ is the outer shell thickness (μm) after sintering.

The paste compositions prepared in Examples 1 to 6 and Comparative Examples 1 and 2 were evaluated by the following methods.

Curing Shrinkage Rate

Each of the paste compositions was applied to a copper substrate, whose surface was plated with Ag, in a manner that the film thickness of the paste after mounting was 30 μm. Then, a gold-backside chip provided with a gold-deposited layer was mounted on a 5 mm×5 mm bonding surface. The product was cured at 190° C. for 60 minutes, resulting in a semiconductor package. The film thickness (μm) after curing was measured using a micrometer (available from Mitutoyo Corporation, device name: MDC-25MX), and the curing shrinkage rate was calculated based on the following equation.

$$\text{Curing shrinkage rate (\%)} = \text{Film thickness of paste after curing}/\text{Film thickness of paste before curing} \times 100$$

Thermal Conductivity

Each of the paste compositions was cured at 190° C. for 2 hours, and a sample cut to a size of 1 cm long×1 cm wide×20 μm thick was prepared. The coefficient of thermal conductivity of the prepared sample was measured in accordance with JIS R 1611:1997 using a thermal conductivity meter (available from Advance Riko, Inc., device name: TC7000) and determined using the laser flash method.

Thermal Resistance

Each of the paste compositions was applied to a copper substrate, whose surface was plated with Ag, in a manner that the film thickness of the paste after mounting was 30 μm. Then, a TEG chip for thermal resistance provided with a gold-deposited layer was mounted on a 5 mm×5 mm bonding surface. The product was cured at 190° C. for 60 minutes, resulting in a semiconductor package. The thermal resistance of the bonding portion of the resulting semiconductor package was measured at room temperature (25° C.) using a thermal resistance measuring device "T3Ster" (available from Mentor Graphics Japan Co., Ltd.).

Volume Resistance

A glass substrate (thickness: 1 mm) was coated with each of the paste compositions to have a thickness of 30 μm using a screen printing method, and curing was carried out at 190° C. for 60 minutes. The volume resistivity of the resultant wiring was measured by a 4-terminal method using a resistivity meter (product name: MCP-T600, available from Mitsubishi Chemical Corporation).

Adhesion

Each of the paste compositions was applied to a PPF (Ni—Pd/Au-plated copper frame) in a manner that the film thickness of the paste after mounting was 30 μm. Then, a 2 mm×2 mm silicon chip was mounted, and curing was carried out at 190° C. for 60 minutes. After curing, the hot die shear strengths at room temperature (25° C.) and 260° C. were measured using a mount strength measuring device (4000 Plus Bond Tester available from Nordson Corporation).

Reliability

Each of the paste compositions was applied to a copper frame, whose surface was plated with Ag, in a manner that the film thickness of the paste after mounting was 30 μm. Then, a gold-backside chip provided with a gold-deposited layer was mounted on a 8 mm×8 mm bonding surface, and curing was carried out at 190° C. for 60 minutes. The resulting sample was subjected to a cooling/heating cycle process (an operation of increasing the temperature from −55° C. to 150° C. and then cooling to −55° C. was considered to be one cycle, and this cycle was repeated 2000 times) in a cooling/heating cycle tester. After the cooling/heating cycle process, the presence of peeling of the chip in the sample was observed with an ultrasonic microscope (FineSAT II, available from Hitachi Power Solutions Co., Ltd.) (number of samples: 5).

TABLE 1

|  | Component |  | Unit | Example 1 | Example 2 | Example 3 | Example 4 | Example 5 | Example 6 | Comparative Example 1 | Comparative Example 2 |
|---|---|---|---|---|---|---|---|---|---|---|---|
| Paste Composition | (A) Silver particles | Silver particles 1 (A1) | parts by mass | 100 | 100 | 100 | 0 | 70 | 100 | 100 | 0 |
|  |  | Silver particles 2 (A2) | parts by mass | 0 | 0 | 0 | 60 | 0 | 0 | 0 | 0 |
|  |  | Silver particles 3 | parts by mass | 0 | 0 | 0 | 0 | 0 | 0 | 0 | 100 |
|  |  | Silver particles 4 | parts by mass | 0 | 0 | 0 | 40 | 30 | 0 | 0 | 0 |
|  | (B) Thermosetting resin | Flexible epoxy resin 1 | parts by mass | 11 | 11 | 0 | 11 | 11 | 11 | 0 | 11 |
|  |  | Flexible epoxy resin 2 | parts by mass | 0 | 0 | 11 | 0 | 0 | 0 | 0 | 0 |
|  |  | Epoxy resin 1 | parts by mass | 0 | 0 | 0 | 0 | 0 | 0 | 11 | 0 |

TABLE 1-continued

| Component | | Unit | Example 1 | Example 2 | Example 3 | Example 4 | Example 5 | Example 6 | Comparative Example 1 | Comparative Example 2 |
|---|---|---|---|---|---|---|---|---|---|---|
| Curing agent (C) | Phenolic resin (C1) | parts by mass | 0.3 | 0.6 | 0.3 | 0.6 | 0.3 | 0.3 | 0.3 | 0.3 |
| | Dicyandiamide (C2) | parts by mass | 0.1 | 0.1 | 0.1 | 0.1 | 0.1 | 0.1 | 0.1 | 0.1 |
| Solvent (D) | Solvent 1 (SP value: 11.8) | parts by mass | 1.6 | 1.6 | 2.4 | 2.4 | 1.6 | 0.5 | 1.6 | 1.6 |
| | Solvent 2 (SP value: 8.5) | parts by mass | 3.7 | 3.7 | 5.5 | 5.5 | 3.7 | 3.2 | 3.7 | 3.7 |
| | Solvent 3 (SP value: 14.2) | parts by mass | 0 | 0 | 0 | 0 | 0 | 1.6 | 0 | 0 |
| Evaluation | Porosity before sintering of silver particles (A) | % | 25 | 25 | 25 | 0 | 25 | 25 | 25 | 0 |
| | Porosity after sintering of silver particles (A) | % | 43 | 43 | 43 | 0 | 43 | 43 | 43 | 0 |
| | Curing shrinkage rate | % | 6.5 | 10 | 7 | 10 | 6.7 | 10 | 20 | 22 |
| | Coefficient of thermal conductivity | W/mK | 50 | 55 | 45 | 40 | 45 | 50 | 55 | 70 |
| | Thermal resistance | K/W | 0.22 | 0.24 | 0.23 | 0.24 | 0.21 | 0.35 | 0.5 | 0.5 |
| | Volume resistance | $\Omega \cdot cm$ | $7.5 \times 10^{-5}$ | $7.2 \times 10^{-5}$ | $7.6 \times 10^{-5}$ | $8.2 \times 10^{-5}$ | $8.0 \times 10^{-5}$ | $7.7 \times 10^{-5}$ | $7.5 \times 10^{-5}$ | $6.2 \times 10^{-5}$ |
| Adhesion | Room temperature (25° C.) | N | 135 | 165 | 130 | 120 | 150 | 132 | 170 | 120 |
| | 260° C. | N | 45 | 55 | 42 | 40 | 50 | 42 | 60 | 40 |
| RELIABILITY | | Number of samples with peeling present/5 | 0 | 0 | 0 | 0 | 0 | 0 | 5 | 5 |

The paste compositions of Examples 1 to 6, which had a curing shrinkage rate of 15% or less, all had a favorable adhesive property; also, the cured products of these paste compositions had a low thermal resistance of 0.4 K/W or less, giving them excellent thermal conductivity and electric conductivity. The paste compositions of Examples 1 to 6 were able to yield semiconductor devices having excellent reliability.

REFERENCE SIGNS

10 Silver particles (secondary aggregate particles)
1 Outer shell
2 Void
3 Inner side of outer shell
4 Outer side of outer shell

The invention claimed is:

1. A paste composition comprising:
silver particles (A);
a thermosetting resin (B);
a curing agent (C); and
a solvent (D),
wherein a shrinkage rate after curing of the paste composition is 15% or less,
wherein the silver particles (A) comprise silver particles (A1) and/or silver particles (A2),
wherein the silver particles (A1) are secondary aggregate particles that have an average particle diameter from 0.5 μm to 2.0 μm and that are aggregates of particles including primary particles having an average particle diameter from 10 nm to 100 nm,
wherein the silver particles (A1) are hollow particles comprising an outer shell formed by particles including aggregated primary particles and a void present inside the outer shell
wherein the silver particles (A2) are secondary aggregate particles that have an average particle diameter of greater than 2.0 μm and 15.0 μm or less and that are aggregates of particles including primary particles having an average particle diameter of greater than 100 nm and 500 nm or less,
wherein the silver particles (A1) have a porosity before sintering, as defined by Equation (1), from 20% to 50%, a porosity after sintering, as defined by Equation (1) and under sintering conditions including a nitrogen atmosphere, a sintering temperature from 175 to 225° C., and a sintering time from 1 to 3 hours, from 30% to 60%, and a rate of change in outer shell thickness due to sintering, as defined by Equation (2), from 15% to 50%:

$$Porosity\ (\%)=Total\ cross\text{-}sectional\ area\ of\ pore\ portions/Total\ cross\text{-}sectional\ area \times 100 \qquad (1)$$

where the total cross-sectional area of pore portions is a sum of cross-sectional areas (μm²) of pore portions included in all silver particles in a visual field when cross sections of silver particles (A1) cut by an ion milling device are observed with a field emission scanning electron microscope (FE-SEM), and the total cross-sectional area is the sum of cross-sectional areas (μm²) of all silver particles in the visual field, $$Rate\ of\ change\ in\ outer\ shell\ thickness\ due\ to\ sintering\ (\%)=(T_A-T_B)/T_A \times 100 \qquad (2)$$ where $T_A$ is the outer shell thickness (μm) before sintering and $T_B$ is the outer shell thickness (μm) after sintering under the sintering conditions.

2. The paste composition according to claim 1, wherein the silver particles (A1) further have a protective molecule attached thereto, an amount of the protective molecule attached being from 0.15 mass % to 3.0 mass % with respect to a total amount of the silver particles (A1).

3. The paste composition according to claim 1, wherein the silver particles (A1) have a positive thermal expansion coefficient in a range from 150 to 300° C. when thermal expansion is measured under conditions including increasing the temperature from 25° C. to 350° C. at a rate of temperature rise of 20° C./min.

4. The paste composition according to claim 1, wherein the thermosetting resin (B) is a liquid flexible epoxy resin.

5. The paste composition according to claim 1, wherein the curing agent (C) comprises a phenol resin (C1) and a dicyandiamide (C2), an amount of a component (C1) compounded being from 1 part by mass to 10 parts by mass with respect to 100 parts by mass of the thermosetting resin (B), an amount of a component (C2) compounded being from 0.5 parts by mass to 5 parts by mass with respect to 100 parts by mass of the thermosetting resin (B), a mass ratio [(C1):(C2)] of the component (C1) to the component (C2) being from 1:1 to 10:1.

6. The paste composition according to claim 1, wherein the solvent (D) comprises a solvent having a solubility parameter (SP value) of 11 or greater, a content of the solvent being from 0.5 mass % to 8.5 mass % with respect to a total amount of the paste composition.

7. A semiconductor device comprising:
a semiconductor element; and
a substrate,
wherein the semiconductor element is adhered to the substrate through a die attach material composed of the paste composition described in claim 1.

8. A paste composition comprising:
silver particles (A);
a thermosetting resin (B);
a curing agent (C); and
a solvent (D),
wherein a shrinkage rate after curing of the paste composition is 15% or less, wherein the silver particles (A) comprise silver particles (A1) and/or silver particles (A2),
wherein the silver particles (A1) are secondary aggregate particles that have an average particle diameter from 0.5 μm to 2.0 μm and that are aggregates of particles including primary particles having an average particle diameter from 10 nm to 100 nm,
wherein the silver particles (A1) are hollow particles comprising an outer shell formed by particles including aggregated primary particles and a void present inside the outer shell
wherein the silver particles (A2) are secondary aggregate particles that have an average particle diameter of greater than 2.0 μm and 15.0 μm or less and that are aggregates of particles including primary particles having an average particle diameter of greater than 100 nm and 500 nm or less,
wherein the curing agent (C) comprises a phenol resin (C1) and a dicyandiamide (C2), an amount of the component (C1) compounded being from 1 part by mass to 10 parts by mass with respect to 100 parts by mass of the thermosetting resin (B), an amount of the component (C2) compounded being from 0.5 parts by mass to 5 parts by mass with respect to 100 parts by mass of the thermosetting resin (B), a mass ratio [(C1):(C2)] of the component (C1) to the component (C2) being from 1:1 to 10:1.

9. The paste composition according to claim 8, wherein a total of silver particles (A1) and silver particles (A2) is 40 mass % or more and 100 mass % or less in the silver particles.

10. The paste composition according to claim 9, wherein Epoxy resins having an epoxy equivalent of 200 or more and 2000 or less and a modulus of elasticity of 0.033 GPa or less after being cured (here, the modulus of elasticity is measured by blending DETA in the epoxy resins before being cured so as to be stoichiometric.

11. The paste composition according to claim 10, wherein curing the epoxy resins at 200 degrees Celsius (° C.) for 2 hours, cutting the epoxy resins into a size of longitudinal 55 mm×lateral 1 cm×thickness 20 μm to prepare a sample, and raising a temperature of the sample from −50 degrees Celsius (° C.) to 300 degrees Celsius (° C.) by 10 degrees Celsius (° C.) per minute using a thermomechanical analyzer in an amount of 1 mass % or more and 20 mass % or less with respect to the composition.

12. The paste composition according to claim 8, wherein the silver particles (A1) further have a protective molecule attached thereto, an amount of the protective molecule attached being from 0.15 mass % to 3.0 mass % with respect to a total amount of the silver particles (A1).

13. The paste composition according to claim 8, wherein the silver particles (A1) have a positive thermal expansion coefficient in a range from 150 to 300° C. when thermal expansion is measured under conditions including increasing a temperature from 25° C. to 350° C. at a rate of temperature rise of 20° C./min.

14. The paste composition according to claim 8, wherein the thermosetting resin (B) is a liquid flexible epoxy resin.

15. The paste composition according to claim 8, wherein the curing agent (C) comprises a phenol resin (C1) and a dicyandiamide (C2), an amount of the component (C1) compounded being from 1 part by mass to 10 parts by mass with respect to 100 parts by mass of the thermosetting resin (B), an amount of the component (C2) compounded being from 0.5 parts by mass to 5 parts by mass with respect to 100 parts by mass of the thermosetting resin (B), a mass ratio [(C1):(C2)] of the component (C1) to the component (C2) being from 1:1 to 10:1.

16. The paste composition according to claim 8, wherein the solvent (D) comprises a solvent having a solubility parameter (SP value) of 11 or greater, a content of the solvent being from 0.5 mass % to 8.5 mass % with respect to a total amount of the paste composition.

17. A semiconductor device comprising:
a semiconductor element; and
a substrate,
wherein the semiconductor element is adhered to the substrate through a die attach material composed of the paste composition described in claim 1.

* * * * *